United States Patent
Clemen, Jr. et al.

(10) Patent No.: US 10,726,986 B2
(45) Date of Patent: Jul. 28, 2020

(54) APPARATUS AND METHOD FOR MAGNETIC FIELD COMPRESSION USING A TOROID COIL STRUCTURE

(71) Applicant: THE BOEING COMPANY, Chicago, IL (US)

(72) Inventors: Mark Joseph Clemen, Jr., Port Orchard, WA (US); John R. Hull, Sammamish, WA (US)

(73) Assignee: The Boeing Company, Chicago, IL (US)

( * ) Notice: Subject to any disclaimer, the term of this patent is extended or adjusted under 35 U.S.C. 154(b) by 465 days.

(21) Appl. No.: 15/785,155

(22) Filed: Oct. 16, 2017

(65) Prior Publication Data

US 2019/0115133 A1 Apr. 18, 2019

(51) Int. Cl.
| | |
|---|---|
| *H01F 7/20* | (2006.01) |
| *H01F 41/08* | (2006.01) |
| *H01F 6/06* | (2006.01) |
| *G01R 33/3815* | (2006.01) |

(52) U.S. Cl.
CPC ......... *H01F 7/204* (2013.01); *G01R 33/3815* (2013.01); *H01F 6/06* (2013.01); *H01F 41/08* (2013.01)

(58) Field of Classification Search
CPC . H01F 7/204; H01F 6/06; H01F 41/08; G01R 33/3815
See application file for complete search history.

(56) References Cited

U.S. PATENT DOCUMENTS

| | | | | |
|---|---|---|---|---|
| 4,217,171 A | * | 8/1980 | Schaffer | H05H 1/52 376/125 |
| 4,277,768 A | * | 7/1981 | Burgeson | H01F 6/06 335/216 |
| 4,305,784 A | | 12/1981 | Ohkawa | |
| 4,920,095 A | * | 4/1990 | Ishigaki | H01F 6/00 322/2 R |
| 5,011,820 A | * | 4/1991 | Ehrhart | H01F 6/00 323/360 |
| 5,675,304 A | * | 10/1997 | Georgiyevskiy | G21B 1/11 335/299 |
| 6,222,434 B1 | * | 4/2001 | Nick | H01F 6/003 335/216 |
| 2009/0278647 A1 | * | 11/2009 | Buswell | H01F 3/06 336/182 |

(Continued)

OTHER PUBLICATIONS

Wikipedia; "Free-electron laser," downloaded from <https://en.wikipedia.org/wiki/Free-electron_laser> on Oct. 13, 2017, 8 Pages.

(Continued)

*Primary Examiner* — Scott Bauer
(74) *Attorney, Agent, or Firm* — Sage Patent Group

(57) ABSTRACT

An apparatus for magnetic field compression includes a toroid and a plurality of separate coils wound around the toroid. The coils are spaced about a circumference of the toroid and each coil generates a magnetic field in response to electric current flowing in the coil. The toroid and a group of the coils each include a size that respectively gradually decreases over a predetermined portion of the toroid. The magnetic field is compressed or has a highest magnetic flux density proximate a central region of the coils around the toroid.

20 Claims, 8 Drawing Sheets

(56) References Cited

U.S. PATENT DOCUMENTS

2016/0049229 A1* 2/2016 Bromberg ................. H01F 6/06
  505/211
2019/0115713 A1* 4/2019 Clemen, Jr. ........... H01S 3/0326

OTHER PUBLICATIONS

Motz, H.; "Applications of the Radiation from Fast Electron Beams," Journal of Applied Physics, 1951, pp. 527-535, vol. 22.

* cited by examiner

APPARATUS AND METHOD FOR MAGNETIC FIELD COMPRESSION USING A TOROID COIL STRUCTURE

CROSS REFERENCE TO RELATED APPLICATION

This application is related to U.S. application Ser. No. 15/784,831, entitled "Apparatus and Method for Magnetic Field Compression," which is assigned to the same assignee as the present application, filed on the same date as the present application, and is incorporated herein by reference.

This application is related to U.S. application Ser. No. 15/785,022, entitled "Apparatus and Method for Generating a High Power Energy Beam Based Laser," which is assigned to the same assignee as the present application, filed on the same date as the present application, and is incorporated herein by reference.

FIELD

The present disclosure relates to devices and methods for generating magnetic fields and more particularly to an apparatus and method for magnetic field compression using a toroid coil structure.

BACKGROUND

Permanent magnetics generate a maximum magnetic field strength or maximum magnetic flux of about one (1) Tesla (T). Magnetic materials that may be used to enhance magnetic field strength or magnetic flux saturate at about 1 T. Substantially higher magnetic field strengths of about 10 T or higher may be achieved in small limited volumes but generally require large coils wound with wire or tape of a superconducting material. Accordingly, there is a need for an apparatus and method for generating large-scale or high strength magnetic fields for certain applications, such as for example, controlling high-energy electron or ion beams or similar radiation beams.

SUMMARY

In accordance with an embodiment, an apparatus for magnetic field compression includes a toroid and a plurality of separate coils wound around the toroid. The coils are spaced about a circumference of the toroid and each coil generates a magnetic field in response to electric current flowing in the coil. The toroid and a group of the coils each include a size that respectively gradually decreases over a predetermined portion of the toroid. The magnetic field is compressed or has a highest magnetic flux density proximate a central region of the coils around the toroid.

In accordance with another embodiment, an apparatus for magnetic field compression includes a first toroid and a first plurality of separate coils wound around the first toroid. The coils being spaced about a circumference of the toroid and each coil generating a magnetic field in response to electric current flowing in the coil. The apparatus also includes a second toroid and a second plurality of separate coils wound around the second toroid. The coils being spaced about a circumference of the second toroid and each coil generating a magnetic field in response to electric current flowing in the coil. A center opening of the first toroid and a center opening of the second toroid are in a same plane and the second toroid is disposed adjacent the first toroid at a predetermined distance from the first toroid. The apparatus further including an aperture defined between two adjacent coils of the first plurality of separate coils and two adjacent coils of the second plurality of separate coils. The magnetic field is compressed within the aperture in response to electric current flowing in the coils of the first plurality of separate coils and the second plurality of separate coils. The predetermined distance or aperture is sized for placing an object in the aperture or the aperture is configured for controlling an electron beam based laser.

In accordance with a further embodiment, a method for magnetic field compression includes providing a toroid and winding a plurality of separate coils around the toroid. The coils are spaced about a circumference of the toroid and each coil generates a magnetic field in response to electric current flowing in the coil. The toroid and a group of the coils each include a size that respectively gradually decreases over a predetermined portion of the toroid. The magnetic field is compressed or has a highest magnetic flux density proximate a central region of the coils around the toroid.

In accordance with another embodiment or any of the previous embodiments, the toroid and each of the coils around the toroid include opposite rounded ends connected by elongated sides.

In accordance with another embodiment or any of the previous embodiments, wherein the predetermined portion includes about half a circumference of the toroid from a pair of points each about half the circumference on the toroid apart.

In accordance with another embodiment or any of the previous embodiments, wherein each of the coils include a superconducting material.

In accordance with another embodiment or any of the previous embodiments, wherein the coils are enveloped in a diamagnetic material or a magnetic material that mimics a behavior of the magnetic flux density for the coils including a superconducting material.

In accordance with another embodiment or any of the previous embodiments, wherein the apparatus further includes an electric current supply electrically connected to each coil.

In accordance with another embodiment or any of the previous embodiments, wherein each electric current supply includes an adjustable current supply configured for adjusting a balance of currents between the coils.

In accordance with another embodiment or any of the previous embodiments, wherein the apparatus further includes a single electric current supply for supplying electrical current to each of the coils.

In accordance with another embodiment or any of the previous embodiments, wherein the coils include a predetermined size for inserting an object within the coils.

In accordance with another embodiment or any of the previous embodiments, wherein the coils are configured to control an electron beam based laser.

In accordance with another embodiment or any of the previous embodiments, wherein the toroid includes an electrical insulation material.

In accordance with another embodiment or any of the previous embodiments, wherein the separate coils are uniformly spaced about the circumference of the toroid.

In accordance with another embodiment or any of the previous embodiments, wherein the toroid defines a first toroid and the plurality of separate coils defines a first plurality of separate coils. The apparatus further includes a second toroid and a second plurality of separate coils wound around the second toroid. The coils are spaced about a circumference of the second toroid and each coil generates a magnetic field in response to electric current flowing in the coil. A center opening of the first toroid and the second toroid are in a same plane and the second toroid is disposed adjacent the first toroid at a predetermined distance from the first toroid. An aperture is defined between two adjacent coils of the first plurality of separate coils and two adjacent coils of the second plurality of separate coils. The magnetic field is compressed within the aperture in response to electric current flowing in the coils of the first plurality of separate coils and the second plurality of separate coils. The predetermined distance or aperture is sized for placing an object in the aperture or the aperture is configured to control an electron beam based laser.

The features, functions, and advantages that have been discussed can be achieved independently in various embodiments or may be combined in yet other embodiments further details of which can be seen with reference to the following description and drawings.

DETAILED DESCRIPTION

Figure 1:
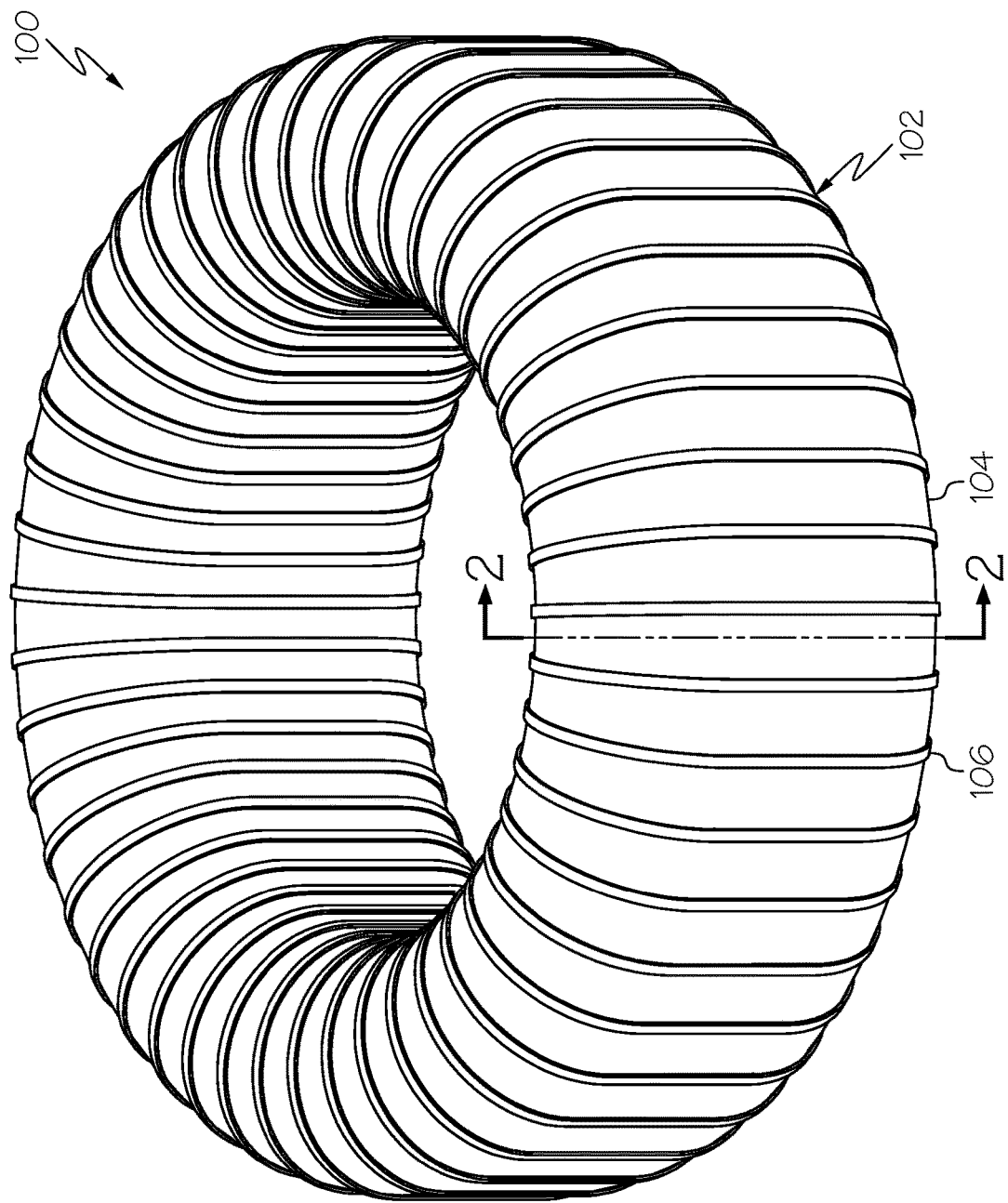
FIG. 1 is a perspective view of an example of an apparatus including a toroid coil structure.

The following detailed description of embodiments refers to the accompanying drawings, which illustrate specific embodiments of the disclosure. Other embodiments having different structures and operations do not depart from the scope of the present disclosure Like reference numerals may refer to the same element or component in the different drawings.

Figure 2:
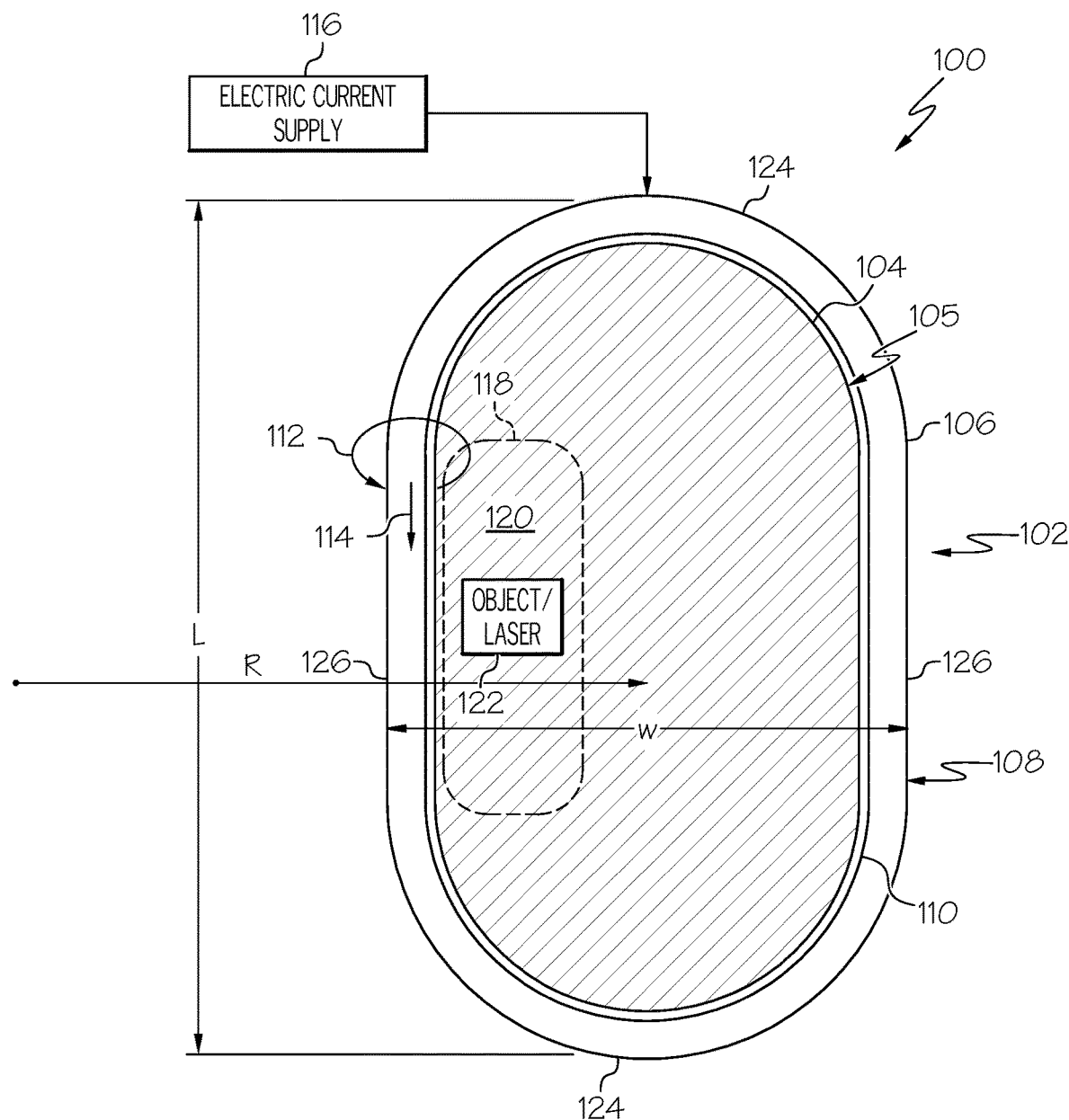
FIG. 2 is a cross-sectional view of the exemplary apparatus in FIG. 1 taken along lines 2-2.

FIG. 1 is a perspective view of an example of an apparatus 100 including a toroid coil structure 102. At a given height and radius, the magnetic field does not change in the circumferential direction, i.e., there is no magnetic flux compression. The apparatus 100 serves as a reference for the embodiments described herein that produce magnetic flux compression. FIG. 2 is a cross-sectional view of the exemplary apparatus 100 in FIG. 1 taken along lines 2-2. A radius of the toroid 104 is represented by the arrow "R." The apparatus 100 or toroid coil structure 102 includes a toroid 104 and a plurality of separate coils 106 wound around the toroid 104. The toroid 104 is formed from an electrical insulator material 105. An example of the electrical insulator material 105 includes but is not necessarily limited to a G10 material or other composite material suitable for cryogenic applications. In accordance with other embodiments, the toroid coil structure 102 includes a geometric shape other than a circular shape or doughnut shape in a plan view of the toroid coil structure 102. In accordance with an example, the toroid coil structure 102 include an elliptical shape, ellipsoid shape or is oblong in one direction. Other geometric shapes are applicable depending upon the application and/or desired distribution of the magnetic field or fields associated with the toroid coil structure 102.

In accordance with the embodiment illustrated in FIG. 1, the coils 106 are uniformly spaced about a circumference of the toroid 104. In another embodiment, the coils 106 are non-uniformly spaced or are spaced according to a preset pattern to provide a particular magnetic field distribution within the toroid 104. The coils 106 include electrically conductive material or semiconductor material. In accordance with an embodiment, the coils 106 are formed from or include a superconducting material 108 (FIG. 2). Examples of the superconducting material 108 include a ceramic material disposed on a substrate 110 (FIG. 2). The substrate 110 is typically a metallic material. Other examples of the superconducting material 108 include but are not necessarily limited to a superconducting crystalline material grown on a surface of the substrate 110. The superconducting ceramic material is plated on the substrate 110, plasma sprayed on the substrate 110, or thermal-sprayed on the substrate 110. The substrate 110 includes any suitable material for growing the superconducting crystalline material or any suitable mechanical frame for the superconducting ceramic material. For example, the substrate 110 includes one of steel, a nickel alloy, carbon fiber composite or other suitable frame material for the superconducting material 108. In accordance with other examples, the superconductors are formed by metalorganic chemical vapor deposition (MOCVD), ion beam assisted deposition (IBAD) or similar superconductor fabrication techniques. Other examples of the superconducting material 108 include a superconducting alloys.

Each coil 106 generates a magnetic field 112 in response to electric current 114 flowing in the coil 106. The electric current includes one of continuous electric current, alternating electric current or pulsed electric current. In accordance with an embodiment, an electric current supply 116 is electrically connected to each coil 106. In another embodiment, a single electric current supply is configured to individual feed each coil 106. The electric current supply 116 or electric current supplies are configured to supply one of continuous electric current, alternating electric current or pulsed electric current. In FIG. 2, the magnetic field 112 has a highest magnetic flux density in a region proximate an inner part of the windings 118 of the coils 106 around a circumference of the toroid 104. In accordance with an embodiment, an aperture 120 is defined within the coils 106 for inserting an object 122 (FIG. 2). The coils 106 include a predetermined size for inserting the object 122 within the coils 106. In accordance with another embodiment described with reference to FIG. 4, an aperture 120 is defined between two coils 106 or 406 (FIG. 4) for inserting an object 122. In accordance with a further embodiment described with reference to FIG. 6, an aperture 120 is defined between two adjacent toroids for inserting an object 122.

In one example, the apparatus 100 is part of a magnetic resonance image machine (not shown) for performing magnetic resonance imaging of the object 122. The apparatus 100 is applicable to non-destructive evaluation and imaging techniques, such as magnetic resonance imaging for medical purposes or other imaging applications. In another example described in U.S. application Ser. No. 15/785,022, entitled "Apparatus and Method for Generating a High Power Energy Beam Based Laser," the object 122 is an electron beam, ion beam or the like that is controlled by the apparatus 100. Accordingly, the coils 106 and/or aperture 120 are configured to control an electron beam, electron beam based laser, ion beam or the like. The apparatus 100 is applicable for any purpose where a high magnetic field strength or high magnetic flux up to about 10 T or higher in the aperture 120 is desired.

In accordance with an example, the electric current supply 116 or electric current supplies are an adjustable electric current supply or supplies configured for adjusting an amplitude and/or frequency of electric current applied to each of the coils 106. The adjustable current supply or supplies are used for balancing the electric currents between the coils 106 or for supplying the electric currents to the coils 106 in a certain scheme or configuration to provide a predetermined magnetic field distribution or predetermined magnetic flux density by the coils 106.

In accordance with the embodiment illustrated in FIGS. 1 and 2, the toroid 104 and each of the coils 106 around the toroid 104 include opposite rounded ends 124 connected by opposite elongated sides 126 as best shown in FIG. 2. Each of the coils 106 include a uniform radial width ("W") and a length ("L"). In other embodiments, the toroid 104 and coils 106 define different geometric shapes depending upon the application and/or magnetic field distribution desired. For example, the cross-section of the toroid coil structure may be circular, elliptical, square or some other geometric shape. In accordance with an embodiment described with reference to FIG. 3, a group of coils 106 include a size that respectively gradually decreases over a predetermined portion of the toroid 104. A cross-section of the toroid 104 gradually decreases over the predetermined portion corresponding to the gradually decreasing size of the coils 106.

Figure 3:
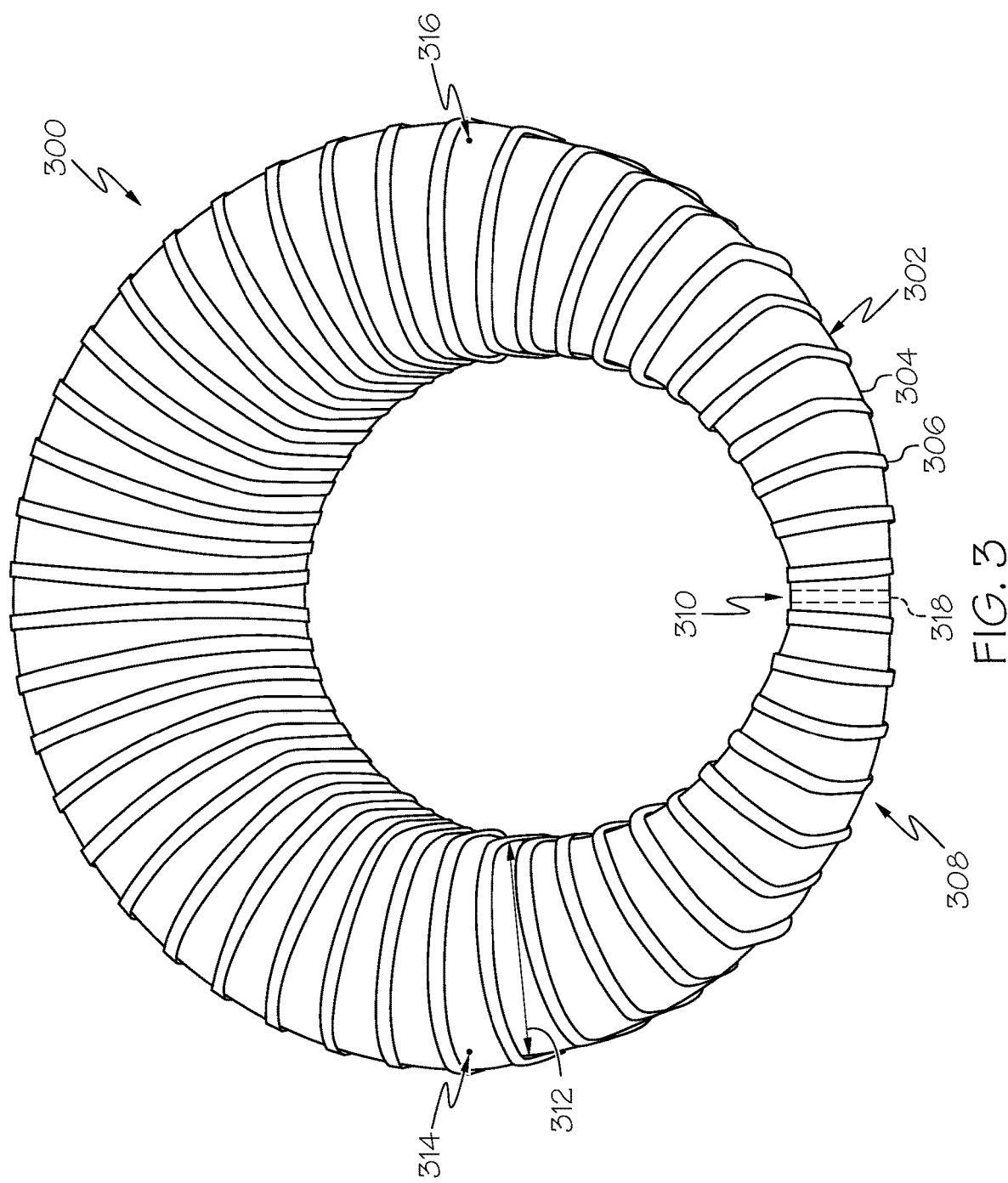
FIG. 3 is a perspective view of an example of an apparatus for magnetic field compression using a toroid coil structure in accordance with another embodiment of the present disclosure.

FIG. 3 is a perspective view of an example of an apparatus 300 for magnetic field compression using a toroid coil structure 302 in accordance with another embodiment of the present disclosure. The apparatus 300 or toroid coil structure 302 includes a toroid 304 and a plurality of separate coils 306. The toroid 304 includes an electrical insulator material 105 (FIG. 2). In accordance with an embodiment, the coils 306 include electrically conductive material or semiconductor material. In accordance with another embodiment, the coils 306 are formed from or include a superconducting material. In accordance with the example shown in FIG. 3, the coils 306 are uniformly spaced about a circumference of the toroid 304. In other embodiments, the coils 306 are non-uniformly spaced or are spaced according to a preset pattern to provide a particular magnetic field distribution within the toroid 304. The apparatus 300 is similar to the apparatus 100 in FIGS. 1 and 2 except a group 308 of the coils 306 include a size that respectively gradually decreases over a predetermined portion 310 of the toroid 304. A cross-section of the toroid 304 gradually decreases in size over the predetermined portion 310 of the toroid 304 in correspondence with the respective gradual decrease in size of the coils 306 over the predetermined portion 310. Accordingly, the width ("W") and length ("L") of the coils 306 and cross-section of the toroid 304 gradual decrease over the predetermined portion 310. In accordance with an example, the coils 306 include radial widths 312 that respectively gradually decrease over about half a circumference of the toroid 304 from a pair of points 314 and 316 each about half the circumference on the toroid 304 apart. The magnetic field 112 is compressed or has a highest magnetic flux density proximate a central region 118 of the coils 306 around the toroid 304. In accordance with an embodiment, an aperture 318 may be defined between any two coils 306 or between the two smallest coils 306 for inserting an object, such as object 122 (FIG. 2). The magnetic field 112 is compressed or has a highest magnetic flux density within the aperture 318 between the two smallest coils 306. In accordance with an embodiment, each of the coils 306 has a structure the same as or similar to the coil 106 described with reference to FIG. 2

Figure 4:
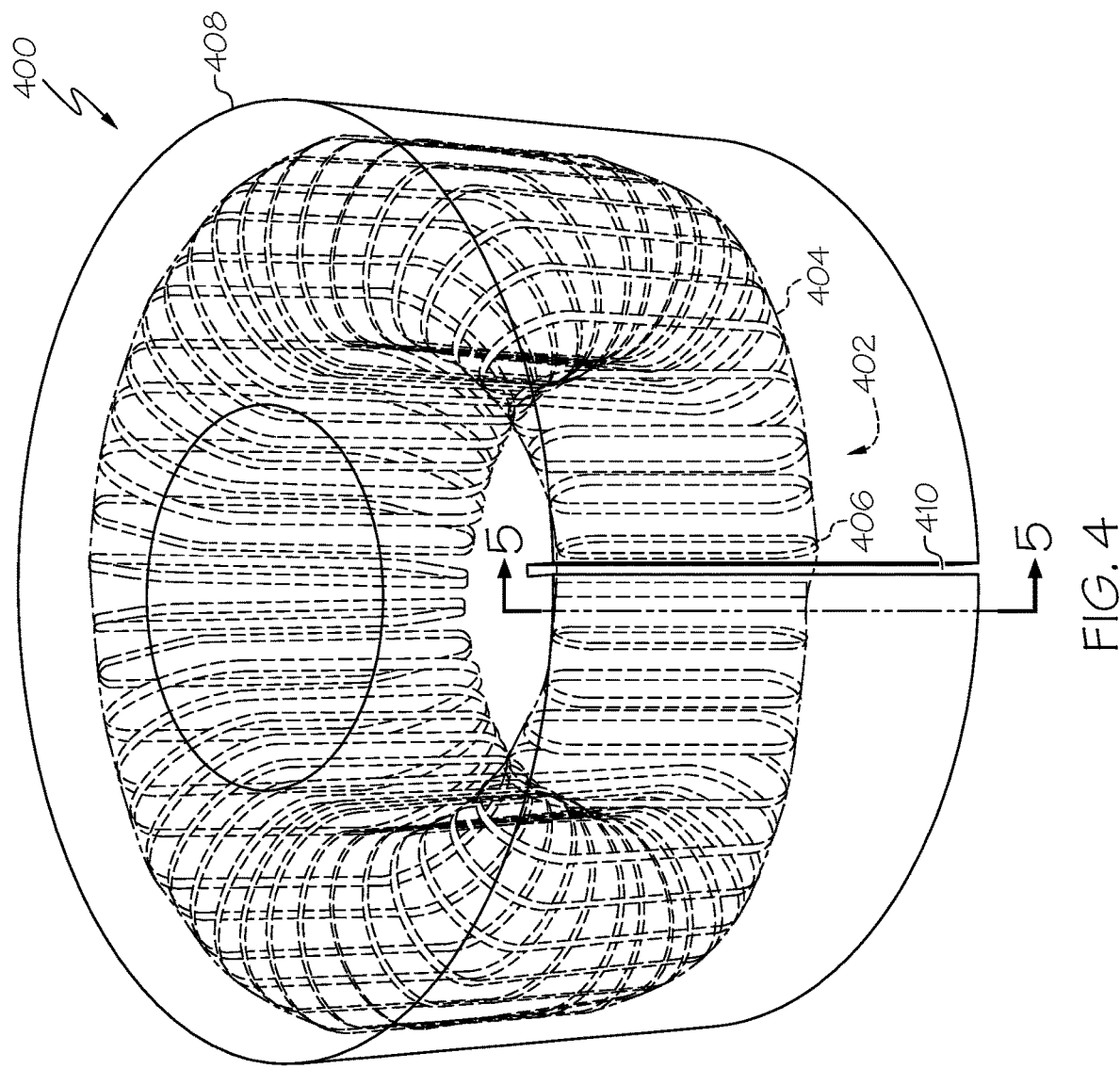
FIG. 4 is a perspective view of an example of an apparatus for magnetic field compression using a toroid coil structure in accordance with a further embodiment of the present disclosure.
Figure 5:
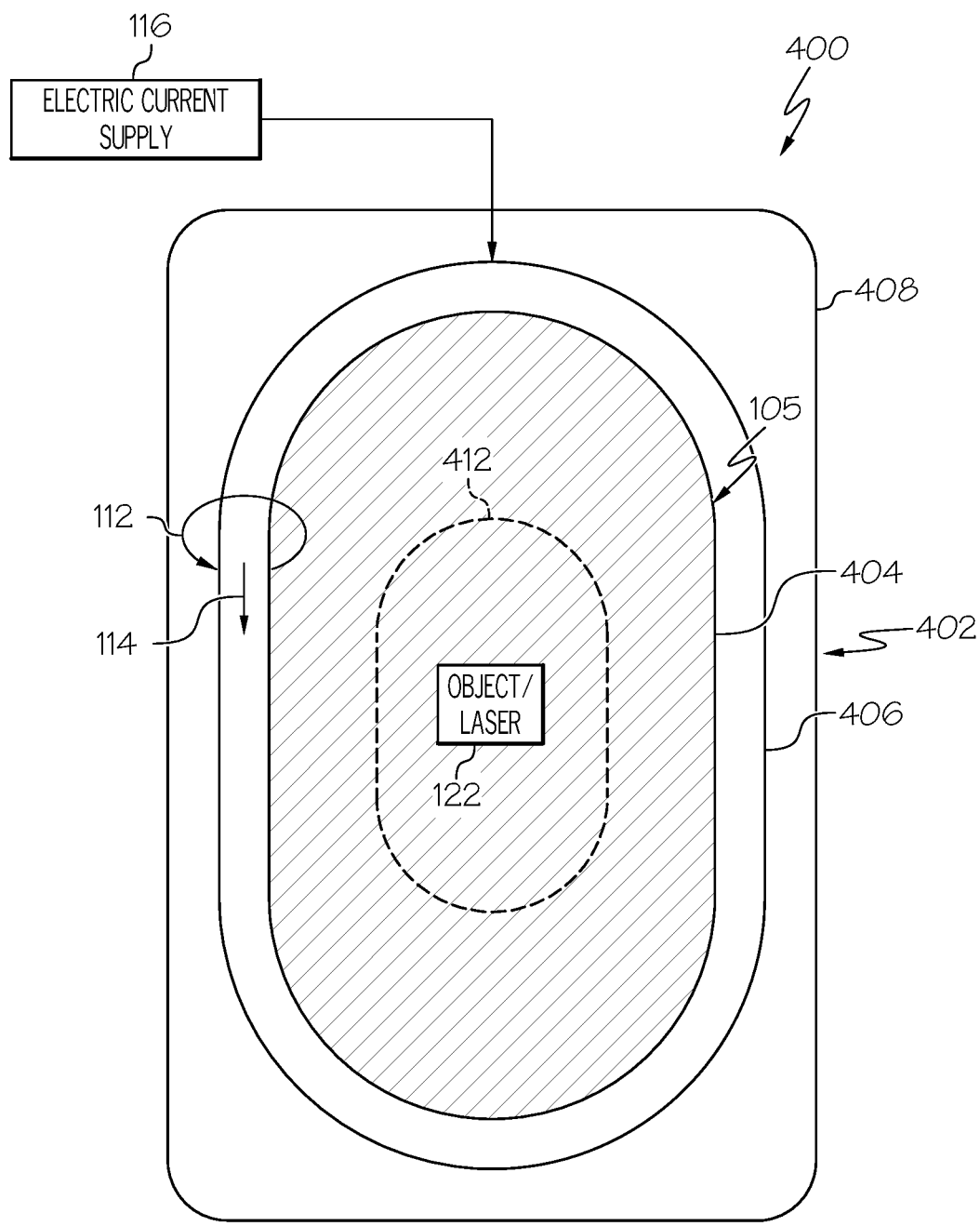
FIG. 5 is a cross-sectional view of the exemplary apparatus for magnetic field compression in FIG. 4 taken along lines 5-5.

FIG. 4 is a perspective view of an example of an apparatus 400 for magnetic field compression using a toroid coil structure 402 in accordance with a further embodiment of the present disclosure. FIG. 5 is a cross-sectional view of the exemplary apparatus 400 for magnetic field compression in FIG. 4 taken along lines 5-5. The toroid coil structure 402 includes a toroid 404 and a plurality of coils 406 wound around the toroid 404. In accordance with an embodiment, the toroid coil structure 402 is similar to the toroid coil structure 102 in FIGS. 1 and 2. In accordance with another embodiment, the toroid coil structure 402 is similar to the toroid coil structure 302 in FIG. 3. The apparatus 400 is similar to the apparatus 100 in FIG. 1 or the apparatus 300 in FIG. 3 except apparatus 400 includes a magnetic material or a diamagnetic material 408 that envelopes the outside of the coils 406 and bridges a space between the coils 406. In accordance with an embodiment, the diamagnetic material 408 includes a relative permeability (magnetic permeability divided by the magnetic permeability of free space) of about 0.001. The diamagnetic material 408 mimics a behavior of the magnetic flux density for the coils 406 including a superconducting material in FIG. 5. In accordance with an embodiment, the diamagnetic material 408 includes an aperture 410 (FIG. 4) in which the magnetic field 112 is compressed. Similar to that previously described, the magnetic field 112 is compressed or has a highest magnetic flux density proximate a center or central region 412 (FIG. 5) of the coils 406 around a circumference of the toroid 404. The apparatus 400 and aperture 410 are sized for inserting an object, such as object 122, within the aperture 410 for performing an operation or function with respect to the object 122 using the compressed magnetic field 112 in the aperture 410 similar to that previously described.

Figure 6:
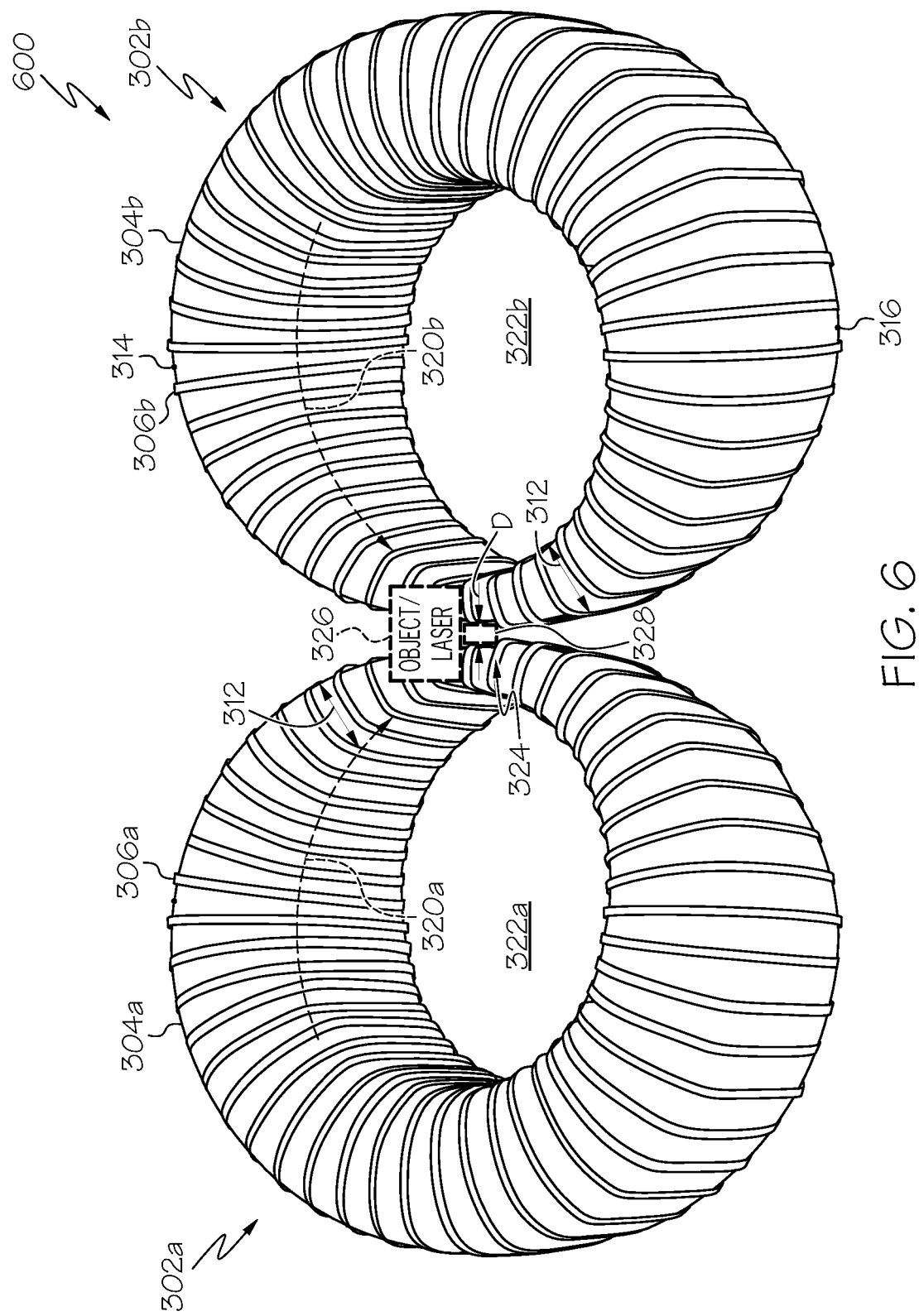
FIG. 6 is a perspective view of an example of an apparatus for magnetic field compression using a pair of toroid coil structures in accordance with another embodiment of the present disclosure.

FIG. 6 is a perspective view of an example of an apparatus 600 for magnetic field compression using a pair of toroid coil structures 302a and 302b in accordance with another embodiment of the present disclosure. The apparatus 600 is similar to the apparatus 700 in FIGS. 7A and 7B in U.S. application Ser. No. 15/785,022, entitled "Apparatus and Method for Generating a High Power Energy Beam Based Laser." In accordance with the exemplary embodiment shown in FIG. 6, each toroid coil structures 302a and 302b is similar to the toroid coil structure 302 in FIG. 3. In accordance with another embodiment each toroid coil structure 302a and 302b is similar to the toroid coil structure 102 in FIG. 1. The apparatus 600 includes a first toroid coil structure 302a and a second toroid structure 302b. The first toroid coil structure 302a includes a first toroid 304a. The second toroid coil structure 302b includes a second toroid 304b. The first toroid 304a and the second toroid 304b include or are formed from an electrical insulator material. An example of the electrical insulator material includes but is not necessarily limited to a G10 material or other composite material suitable for cryogenic applications.

A first plurality of separate coils 306a are wound around the first toroid 304a. The first plurality of coils 306a are placed about a circumference of the first toroid 304a and each coil 306a generates a first magnetic field 320a in response to electric current 114 (FIG. 5) flowing in the coils 306a. A second plurality of separate coils 306b are wound around the second toroid 304b. The second plurality of coils 306b are placed about a circumference of the second toroid 304b and each coil 306b generates a second magnetic field 320b in response to electric current 114 flowing in the coils 306b. Each coil 306a and 306b includes electrically conductive material or semiconductor material. In accordance with an embodiment, the coils 306a and 306b are formed from or include a superconducting material 108 similar to that previously described.

A circular center opening 322a of the first toroid coil structure 302a and a circular center opening 322b of the second toroid coil structure 302b are in a same plane and the second toroid coil structure 302b is disposed adjacent the first toroid coil structure 302a at a predetermined distance ("D") from the first toroid coil structure 302a. An aperture 324 is defined between two adjacent coils of the first plurality of separate coils 306a and two adjacent coils of the second plurality of separate coils 306b. The magnetic fields 320a and 320b are compressed within the aperture 324 in response to electric current flowing in the coils of the first plurality of separate coils 306a and the second plurality of separate coils 306b. The predetermined distance D or aperture 324 is sized for placing an object 326 in the aperture 324. In accordance with an embodiment, the aperture 324 is configured for controlling an electron beam based laser similar to that described in U.S. application Ser. No. 15/785,022, entitled "Apparatus and Method for Generating a High Power Energy Beam Based Laser."

In accordance with the embodiment illustrated in FIG. 6, the first plurality of coils 306a are uniformly spaced about the circumference of the first toroid 304a and the second plurality of coils 306b are uniformly spaced about the circumference of the second toroid 304b. In another embodiment, the first plurality of coils 306a and/or the second plurality of coils 306b are non-uniformly spaced or are spaced according to a preset pattern to provide a particular magnetic field distribution within the first toroid coil structure 302a and/or the second toroid coil structure 302b.

In accordance with an embodiment, the toroid coil structures 302a and 302b are encased or enclosed in a magnetic or diamagnetic material similar to diamagnetic material 408 in FIG. 4. In accordance with an example, a piece material 328 including a predetermined relative permeability is inserted into the aperture 324 or a portion of the aperture 324 to control or adjust the compression or strength of the magnetic fields 320a and 320b within the aperture 324. In accordance with a further embodiment the relative permeability is less than 1.0. For example, the aperture 324 includes an air gap (relative permeability of 1.0) or a piece of material 328 with a relative permeability less than 1.0 is inserted into the aperture 324 or portion of the aperture 324 to control or adjust the compression or strength of the magnetic fields 320a and 320b within the aperture 324.

Figure 7:
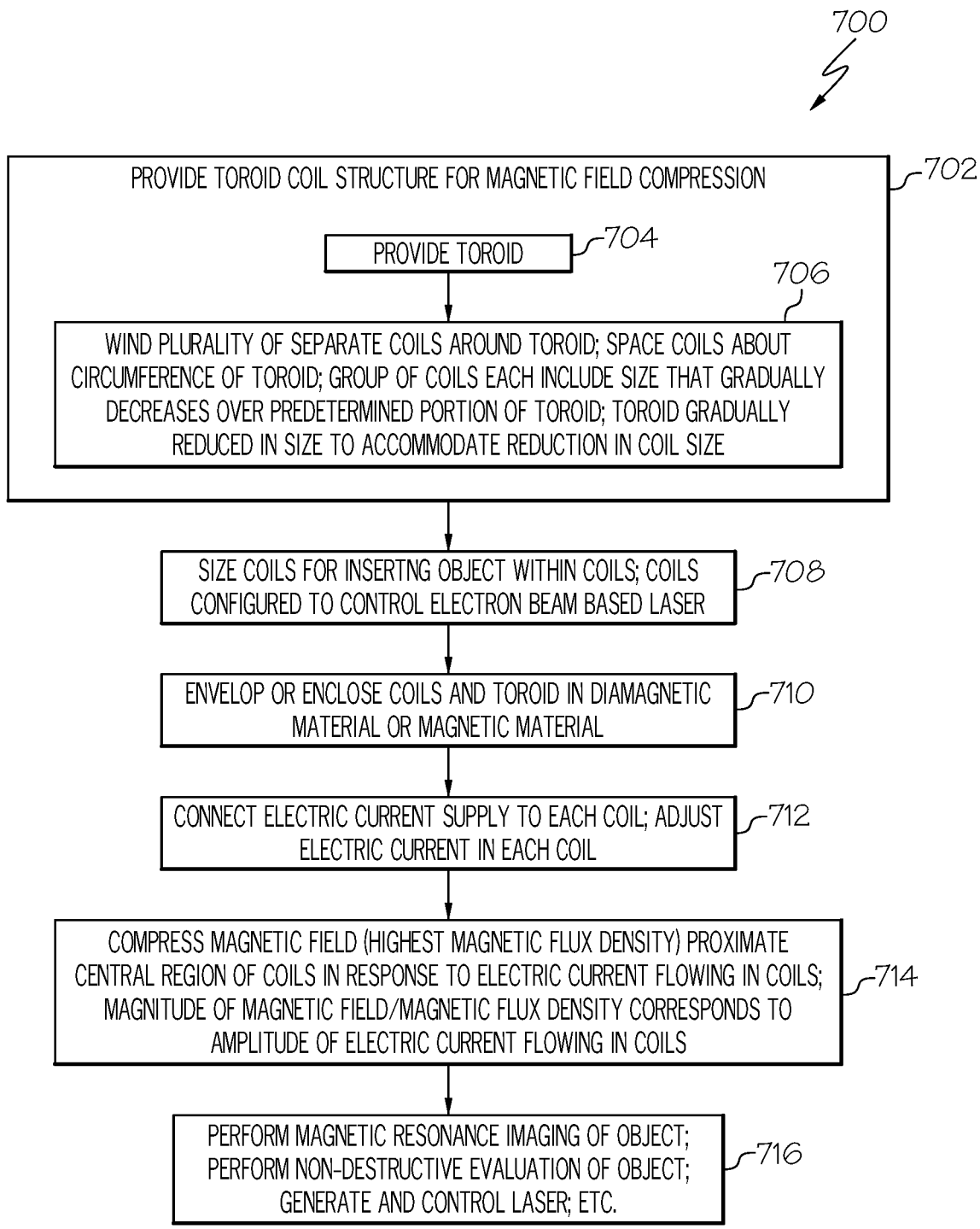
FIG. 7 is a flow chart of an example of a method for magnetic field compression in accordance with an embodiment of the present disclosure.

FIG. 7 is a flow chart of an example of a method 700 for magnetic field compression in accordance with an embodiment of the present disclosure. The method 700 may be embodied in and performed by the apparatus 100 in FIGS. 1 and 2, apparatus 300 in FIG. 3, apparatus 400 in FIGS. 4 and 5 or apparatus 600 in FIG. 6. In block 702, a toroid coil structure is provided. In accordance with an embodiment, block 702 includes blocks 704 and 706. In block 702, a toroid is provided. In block 706, a plurality of separate coils are wound around the toroid. The coils are spaced about a circumference of the toroid and each coil generates a magnetic field in response to electric current flowing in the coil. The coils are uniformly spaced or non-uniformly spaced. The magnetic field is compressed or has a highest magnetic flux density proximate a central region of the coils around the toroid. In accordance with an embodiment, a size of the coils gradually decreases over a predetermined portion of the toroid. A cross-section of the toroid gradually reduces in size to accommodate or correspond with the reduction in coil size.

In block 708, the coils are sized for inserting an object within the coils. In accordance with another embodiment, the coils are configured to control an electron beam based laser. In block 710, the coils and toroid are enveloped or enclosed in a diamagnetic material or a magnetic material.

In block 712, an electric current supply is connected to each coils. In another embodiment a single electric current supply is configured to supply electric current to each of the coils. In accordance with a further embodiment, the electric current supply is an adjustable current supply to adjust an amplitude and/or frequency of the electric current applied to each coil for balancing the electric currents between the coils or for supplying electric current with a particular amplitude and/or frequency to each coil to provide a predetermined magnetic field distribution or magnetic flux density associated with the coils.

In block 714, the magnetic field is compressed or has a highest magnetic flux density proximate a center or central region of the coils about a circumference of the toroid in response to electric current flowing in the coils. The compressed magnetic field results in a highest magnetic flux density in the center or central region of the coils compared to outside the center or central region of the coils or external to the coils. A magnitude of the magnetic field or magnetic flux density corresponds to an amplitude of the electric current flowing in the coils.

In block 716, in accordance with an embodiment, magnetic resonance imaging of an object is performed using the compressed magnetic field or fields. In accordance with another embodiment non-destructive evaluation is performed on an object using the compressed magnetic field or fields or some other function is performed using the compressed magnetic field or fields. In a further embodiment, an electron beam based laser or similar laser is generated and controlled using the magnetic field or fields similar to that described in U.S. application Ser. No. 15/785,022, entitled "Apparatus and Method for Generating a High Power Energy Beam Based Laser."

Figure 8:
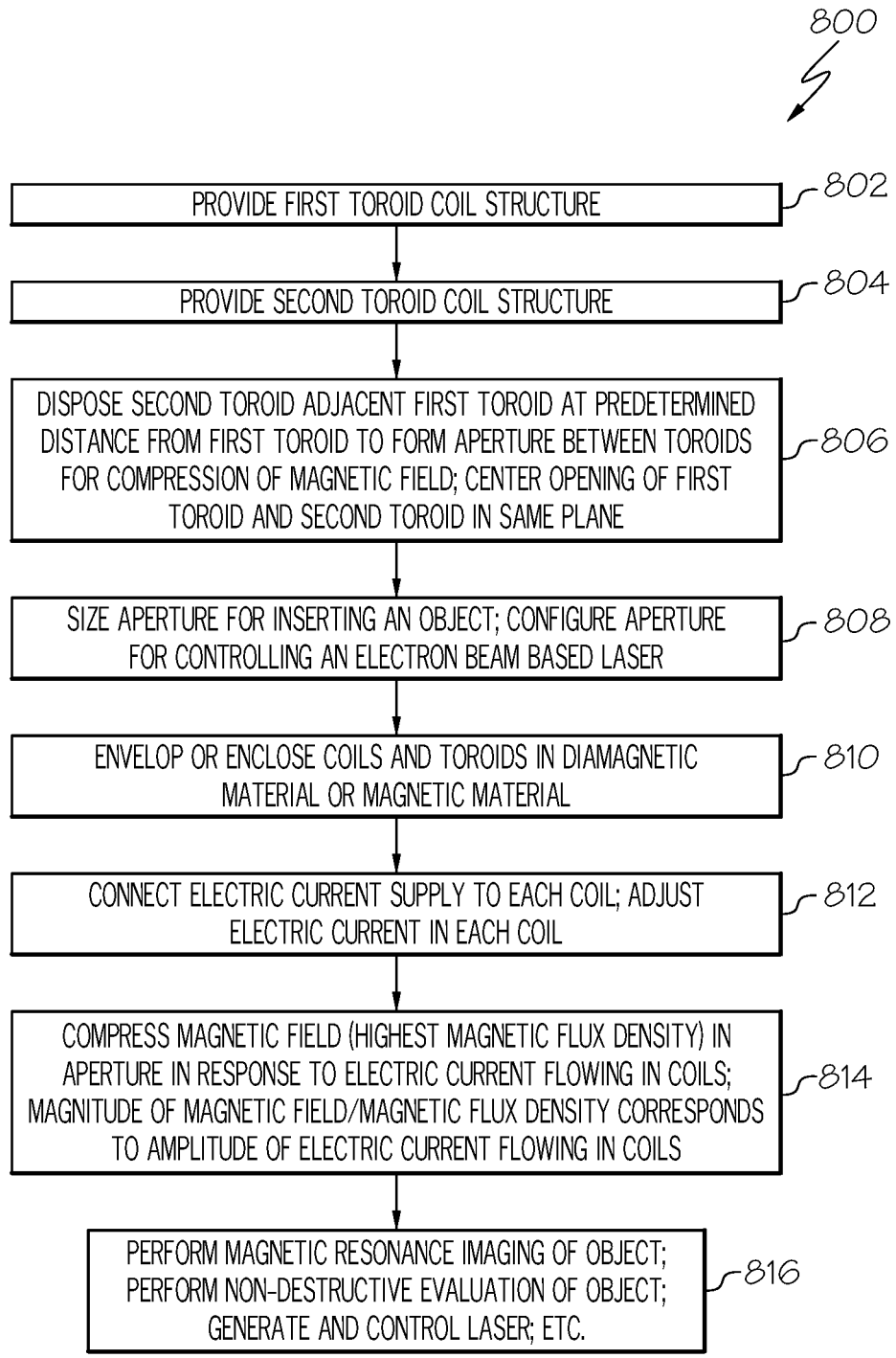
FIG. 8 is a flow chart of an example of a method for magnetic field compression in accordance with another embodiment of the present disclosure.

FIG. 8 is a flow chart of an example of a method 800 for magnetic field compression in accordance with another embodiment of the present disclosure. In accordance with an embodiment, the method 800 is embodied in and performed by the apparatus 600 in FIG. 6.

In block 802, a first toroid coil structure is provided and in block 804, a second toroid coil structure is provided. The first toroid coil structure and the second toroid coil structure are similar to the toroid coil structures described with reference to FIGS. 3 and 6.

In block 806, the second toroid coil structure is disposed adjacent the first toroid coil structure at a predetermined distance from the first toroid coil structure to form an aperture between the toroid coil structures for compression of a magnetic field. A center opening of the first toroid and the second toroid are in a same plane.

In block 808, the aperture is sized for inserting an object. In accordance with another embodiment, the aperture is configured for controlling an electronic beam based laser. An example of configuring an aperture between a pair of toroid coil structures is described in more detail in U.S. application Ser. No. 15/785,022, entitled "Apparatus and Method for Generating a High Power Energy Beam Based Laser."

In block 810, the coils and toroids are enveloped or enclosed in a diamagnetic material or magnetic material.

In block 812, an electric current supply is connected to each coils. In another embodiment a single electric current supply is configured to supply electric current to each of the coils. In accordance with a further embodiment, the electric current supply is an adjustable current supply to adjust an amplitude and/or frequency of the electric current applied to each coil for balancing the electric currents between the coils or for supplying electric current with a particular amplitude and/or frequency to each coil to provide a predetermined magnetic field distribution or magnetic flux density associated with the coils.

In block 814, the magnetic field or fields are compression or have a highest magnetic flux density in the aperture in response to electric current flowing in the coils. The compressed magnetic fields results in a highest magnetic flux density in the aperture relative to outside the aperture or external to the toroids. A magnitude of the magnetic field or magnetic flux density corresponds to an amplitude of the electric current flowing in the coils.

In block 816, in accordance with an embodiment, magnetic resonance imaging of an object is performed using the compressed magnetic field or fields. In accordance with another embodiment non-destructive evaluation is performed on an object using the compressed magnetic field or fields or some other function is performed using the compressed magnetic field or fields. In a further embodiment, an electron beam based laser or similar laser is generated and controlled using the magnetic field or fields similar to that described in U.S. application Ser. No. 15/785,022, entitled "Apparatus and Method for Generating a High Power Energy Beam Based Laser."

In accordance with exemplary embodiments, the apparatuses and methods described herein are usable as part of a magnetic resonance image machine (not shown) for performing magnetic resonance imaging of an object, such as object 122. The apparatuses and methods are applicable to non-destructive evaluation and imaging techniques, such as magnetic resonance imaging for medical purposes or other imaging applications. In another example described in U.S. application Ser. No. 15/785,022, entitled "Apparatus and Method for Generating a High Power Energy Beam Based Laser," the object 122 is an electron beam, ion beam or the like that is controlled by the apparatus. Accordingly, the coils and/or aperture described herein are configured to control an electron beam, electron beam based laser, ion beam or the like. The apparatuses and methods described herein are applicable for any purpose where magnetic field compression or a high magnetic field strength or high magnetic flux up to about 10 T or higher is desired.

The flowchart and block diagrams in the Figures illustrate the architecture, functionality, and operation of possible implementations of systems, methods, and computer program products according to various embodiments of the present disclosure. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The terminology used herein is for the purpose of describing particular embodiments only and is not intended to be limiting of embodiments of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present embodiments has been presented for purposes of illustration and description, but is not intended to be exhaustive or limited to embodiments in the form disclosed. Many modifications and variations will be apparent to those of ordinary skill in the art without departing from the scope and spirit of embodiments.

Although specific embodiments have been illustrated and described herein, those of ordinary skill in the art appreciate that any arrangement which is calculated to achieve the same purpose may be substituted for the specific embodiments shown and that the embodiments have other applications in other environments. This application is intended to cover any adaptations or variations. The following claims are in no way intended to limit the scope of embodiments of the disclosure to the specific embodiments described herein.

What is claimed is:

1. An apparatus for magnetic field compression, comprising:
   a toroid; and
   a plurality of separate coils wound around the toroid, the coils being spaced about a circumference of the toroid and each coil generating a magnetic field in response to electric current flowing in the coil, wherein the toroid and a group of the coils each comprise a size that respectively gradually decreases over a predetermined portion of the toroid, the magnetic field being compressed or having a highest magnetic flux density proximate a central region of the coils around the toroid.

2. The apparatus of claim 1, wherein the toroid and each of the coils around the toroid comprise opposite rounded ends connected by elongated sides.

3. The apparatus of claim 1, wherein the predetermined portion comprises about half a circumference of the toroid from a pair of points each about half the circumference on the toroid apart.

4. The apparatus of claim 1, wherein each of the coils comprise a superconducting material.

5. The apparatus of claim 1, wherein the coils are enveloped in a diamagnetic material or a magnetic material that mimics a behavior of the magnetic flux density for the coils comprising a superconducting material.

6. The apparatus of claim 1, further comprising an electric current supply electrically connected to each coil.

7. The apparatus of claim 6, wherein each electric current supply comprises an adjustable current supply configured for adjusting a balance of currents between the coils.

8. The apparatus of claim 1, further comprising a single electric current supply for supplying electrical current to each of the coils.

9. The apparatus of claim 1, wherein the coils comprise a predetermined size for inserting an object within the coils.

10. The apparatus of claim 9, wherein the coils are configured to control an electron beam based laser.

11. The apparatus of claim 1, wherein the toroid comprises an electrical insulation material.

12. The apparatus of claim 1, wherein the separate coils are uniformly spaced about the circumference of the toroid.

13. The apparatus of claim 1, wherein the toroid defines a first toroid and the plurality of separate coils defines a first plurality of separate coils, the apparatus further comprising:
a second toroid;
a second plurality of separate coils wound around the second toroid, the coils being spaced about a circumference of the second toroid and each coil generating a magnetic field in response to electric current flowing in the coil, wherein a center opening of the first toroid and a center opening of the second toroid are in a same plane and the second toroid is disposed adjacent the first toroid at a predetermined distance from the first toroid; and
an aperture being defined between two adjacent coils of the first plurality of separate coils and two adjacent coils of the second plurality of separate coils, the magnetic field being compressed within the aperture in response to electric current flowing in the coils of the first plurality of separate coils and the second plurality of separate coils, the predetermined distance or aperture being sized for placing an object in the aperture or the aperture being configured for controlling an electron beam based laser.

14. An apparatus for magnetic field compression, comprising:
a first toroid;
a first plurality of separate coils wound around the first toroid, the coils being spaced about a circumference of the toroid and each coil generating a magnetic field in response to electric current flowing in the coil;
a second toroid;
a second plurality of separate coils wound around the second toroid, the coils being spaced about a circumference of the second toroid and each coil generating a magnetic field in response to electric current flowing in the coil, wherein a center opening of the first toroid and a center opening of the second toroid are in a same plane and the second toroid is disposed adjacent the first toroid at a predetermined distance from the first toroid; and
an aperture being defined between two adjacent coils of the first plurality of separate coils and two adjacent coils of the second plurality of separate coils, the magnetic field being compressed within the aperture in response to electric current flowing in the coils of the first plurality of separate coils and the second plurality of separate coils, the predetermined distance or aperture being sized for placing an object in the aperture or the aperture being configured for controlling an electron beam based laser.

15. The apparatus of claim 14, wherein the first toroid and a group of coils of the first plurality of separate coils each comprise a size that respectively gradually decreases over a predetermined portion of the first toroid, and wherein the second toroid and a group of coils of the second plurality of separate coils each comprise a size that respectively gradually decreases over a predetermined portion of the second toroid, the predetermine portion of the first toroid and the predetermined portion of the second toroid being proximate where the first toroid and the second toroid are closest one another.

16. The apparatus of claim 15, wherein the predetermined portion of the first toroid and the second toroid comprise about half a circumference of each toroid from a pair of points each about half the circumference on the toroid apart.

17. The apparatus of claim 14, wherein the coils are enveloped in a diamagnetic material or a magnetic material.

18. The apparatus of claim 14, wherein the coils comprise a superconducting material.

19. A method for magnetic field compression, comprising:
providing a toroid; and
winding a plurality of separate coils around the toroid, the coils being spaced about a circumference of the toroid and each coil generating a magnetic field in response to electric current flowing in the coil, wherein the toroid and a group of the coils each comprise a size that respectively gradually decreases over a predetermined portion of the toroid, the magnetic field being compressed or having a highest magnetic flux density proximate a central region of the coils around the toroid.

20. The method of claim 19, further comprising enveloping the toroid and coils in a diamagnetic material.

* * * * *